United States Patent
Yu et al.

(10) Patent No.: US 7,619,889 B2
(45) Date of Patent: Nov. 17, 2009

(54) CONTROLLABLE HEAT TRANSFER MEDIUM SYSTEM AND METHOD FOR USE WITH A CIRCUIT BOARD

(75) Inventors: Zhihai Zack Yu, Petaluma, CA (US); Jeong H. Kim, Sunnyvale, CA (US); Tommy C. Lee, Danville, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 11/841,547

(22) Filed: Aug. 20, 2007

(65) Prior Publication Data

US 2009/0050309 A1   Feb. 26, 2009

(51) Int. Cl.
H05K 7/20   (2006.01)

(52) U.S. Cl. ............ 361/699; 361/689; 361/690; 361/695; 361/696; 361/697; 361/700; 361/701; 174/15.1; 174/15.2; 174/16.1; 174/16.3; 165/80.3; 165/80.4

(58) Field of Classification Search ............. None
See application file for complete search history.

(56) References Cited

U.S. PATENT DOCUMENTS

| | | | | |
|---|---|---|---|---|
| 6,058,012 A | * | 5/2000 | Cooper et al. | 361/704 |
| 6,134,667 A | * | 10/2000 | Suzuki et al. | 713/300 |
| 6,647,320 B1 | * | 11/2003 | Inoue | 700/300 |
| 6,798,660 B2 | * | 9/2004 | Moss et al. | 361/699 |
| 6,935,130 B2 | * | 8/2005 | Cheng et al. | 62/259.2 |
| 6,999,312 B1 | * | 2/2006 | Garnett et al. | 361/687 |
| 7,151,667 B2 | * | 12/2006 | Walters et al. | 361/699 |
| 7,203,063 B2 | * | 4/2007 | Bash et al. | 361/699 |
| 7,231,961 B2 | * | 6/2007 | Alex et al. | 165/80.4 |
| 7,372,698 B1 | * | 5/2008 | Tilton et al. | 361/701 |
| 7,417,858 B2 | * | 8/2008 | Ouyang | 361/699 |
| 7,436,673 B2 | * | 10/2008 | Wang et al. | 361/719 |
| 7,456,751 B2 | * | 11/2008 | Arai et al. | 340/584 |
| 7,508,671 B2 | * | 3/2009 | Sauciuc et al. | 361/700 |
| 2007/0146993 A1 | * | 6/2007 | Mongia et al. | 361/695 |
| 2008/0198550 A1 | * | 8/2008 | Wang et al. | 361/700 |
| 2008/0253082 A1 | * | 10/2008 | Lev et al. | 361/687 |

* cited by examiner

*Primary Examiner*—Boris L Chervinsky
(74) *Attorney, Agent, or Firm*—Zilka-Kotab, PC

(57) ABSTRACT

A system and method are provided for controlling a transfer of heat between circuit board components. Included is a circuit board with components mounted thereon. Also provided is a controllable heat transfer medium for controlling a transfer of heat between the components.

18 Claims, 6 Drawing Sheets

CONTROLLABLE HEAT TRANSFER MEDIUM SYSTEM AND METHOD FOR USE WITH A CIRCUIT BOARD

FIELD OF THE INVENTION

The present invention relates to heat exchange systems, and more particularly to heat exchange systems for integrated circuits.

BACKGROUND

Circuit boards are typically equipped with heat exchange systems for cooling integrated circuits mounted on such boards. For example, a motherboard often employs such a heat exchange system for the purpose of cooling various related components [e.g. a central processing unit (CPU), memory circuits, graphics processor, etc.]. To improve operation of such heat exchange systems, a heat transfer medium (e.g. heat pipe, etc.) is often positioned between the circuit board components and/or any related heat exchangers.

To date, the use of the foregoing heat transfer medium has been passive in nature, thereby allowing the heat transfer medium to unconditionally transfer heat from one area of the circuit board to another. While, in certain circumstances, this may be acceptable if not desired, other situations arise where it is not. Just by way of example, a first integrated circuit may produce more heat than a second integrated circuit, and thus allow for dissipation of such heat via an interconnected heat transfer medium. However, in the case where the second integrated circuit has a lower temperature threshold, such heat transfer may be undesired. There is thus a need for addressing this and/or other issues associated with the prior art.

SUMMARY

A system and method are provided for controlling a transfer of heat between circuit board components. Included is a circuit board with components mounted thereon. Also provided is a controllable heat transfer medium for controlling a transfer of heat between the components.

DETAILED DESCRIPTION

Figure 1A:
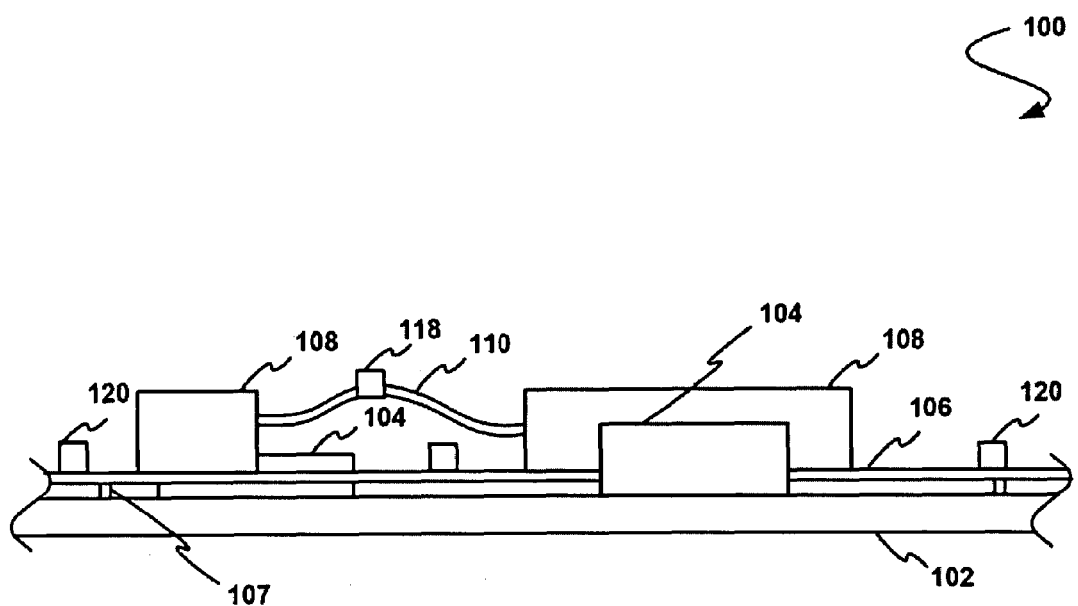
FIG. 1A shows a heat exchange system equipped with a carrier, in accordance with one embodiment.

FIG. 1A shows a heat exchange system 100 equipped with a carrier, in accordance with one embodiment. As shown, a circuit board 102 is provided with a plurality of mounted components 104. Such components may include, in various embodiments, integrated circuits, a power sub-system, and/or any other component that is capable of being mounted to the circuit board. In one possible embodiment, the circuit board may include a motherboard, for example. Of course, the circuit board may include any board adapted for support circuits, and possibly any other components mentioned above.

As further shown, a carrier 106 is directly or indirectly coupled to the circuit board. As shown, the carrier may take on a substantially planar configuration. It should be noted, however, that the carrier may take other forms that provide for the coupling of heat exchangers, as will soon become apparent.

In various embodiments, the foregoing coupling between the carrier and the circuit board may take any desired form that maintains the carrier connected to the circuit board. In one embodiment, such coupling may be provided by way of mounts 107 (e.g. posts, etc.) that are integrally coupled to a bottom face of the carrier for coupling with the circuit board (e.g. via screws, etc.). Of course, other embodiments are contemplated in which such coupling may take other forms that meet the above definition.

Still yet, heat exchangers 108 are directly or indirectly coupled to the carrier for transferring heat from the components. As shown, the heat exchangers are coupled to a top face of the carrier, in accordance with one embodiment. Other embodiments are contemplated, however, in which the heat exchangers may be coupled to other portions of the carrier (e.g. along a side face, etc.).

In the context of the present description, the aforementioned heat exchangers may include any passive and/or active heat exchangers that are capable of transferring heat. Some non-limiting examples of such heat exchangers include a heat sink, a fan, a liquid-cooled apparatus, etc.

In use, the type of heat exchangers and specific positioning thereof may be selected in any desired manner that accommodates desired heat transfer from one or more of the components. Such configurability may be based on any desired factor that may depend on the design/operation of the circuit board and/or the desires of the user. In one embodiment, the heat exchangers may be removably coupled to the carrier to allow for replacement, rearrangement, and/or substitution of the heat exchangers with respect to the various components on the circuit board.

By this design, the carrier may, in one embodiment, be standardized at least with respect to a current model of the circuit board (as an option). Further, users of the circuit board may be afforded flexibility in terms of what type of heat exchangers are used, how the heat exchangers are positioned with respect to various components, etc.

In another embodiment, a heat transfer medium 10 may be coupled between the heat exchangers for transferring heat between them. In the context of the present description, the heat transfer medium may include any medium capable of transferring heat between two or more of the circuit board components (e.g. via corresponding heat exchangers, etc.). In one embodiment, such heat transfer medium may include a device that transfers heat by the evaporation and condensation of an internal fluid. Examples of such heat transfer medium may include, but are certainly not limited to a heat pipe, a vapor chamber, a thermal chamber, etc.

In various embodiments, the heat transfer medium may or may not be integrated with the carrier. As an option, the heat transfer medium may even be removably coupled between the heat exchangers for accommodating versatility in the selection and positioning of the heat exchangers.

In such embodiment, one or more heat transfer medium controllers 118 may be coupled to the heat transfer medium. In the context of the present description, the heat transfer medium controller may be anything capable of controlling at least one aspect of the heat transfer medium. For example, the controller may include at least one valve for controlling the transfer of heat in the heat transfer medium.

In another optional embodiment, sensors 120 may be coupled to the carrier for use in controlling a transfer of heat from at least one of the components. While the sensors are shown to be coupled to a top face of the carrier, it should be noted that the sensors may be attached to the carrier in any desired manner (e.g. to the bottom face, via an extending member, etc.). In use, the sensors may be used in conjunction with any aspect of the system that is capable controlling a transfer of heat from at least one of the components.

In one embodiment, the sensor(s) may be used to control one or more heat exchangers. For example, such control may involve the activation, deactivation, throttling, directing, and/or controlling any other aspect of the heat exchanger(s). In another embodiment, the sensor(s) may be used to control the heat transfer medium (e.g. via the heat transfer medium controller, etc.).

As an option, the sensors may, in one embodiment, be coupled to the carrier with a fixed distance between each of the sensors and a corresponding one of the components. For example, one or more first sensors may be coupled to the carrier a first predetermined distance from a first component, one or more second sensors may be coupled to the carrier a second predetermined distance from a second component, and so on. In such embodiment, such configuration of the sensors on the carrier may be standardized, such that, by using the carrier, the foregoing distances may be assumed to be present.

In use, such fixed distances may thus optionally allow heat exchange system designers to "pre-characterize" such sensors. In other words, since the predetermined distance(s) between the sensors and the associated component(s) may be assumed (by virtue of the use of the sensor-equipped carrier), there is not necessarily a need to calibrate a heat exchange system to accommodate for the possibility that a sensor-to-component distance may vary from system to system. By this design, characterization of the sensors for completed circuit boards may be avoided.

Figure 1B:
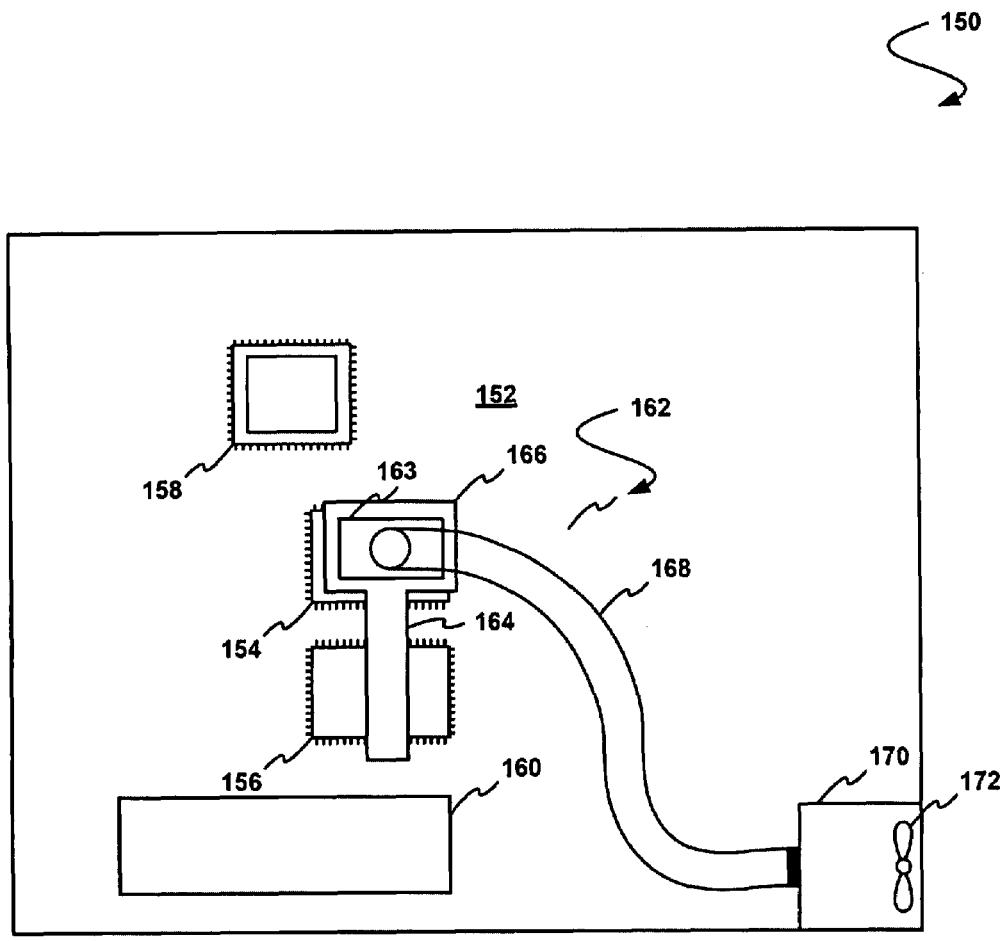
FIG. 1B shows a heat exchange system for circulating external air about a northbridge circuit and the southbridge circuit, in accordance with one embodiment.

FIG. 1B shows a heat exchange system 150 for circulating external air about the northbridge circuit and the southbridge circuit, in accordance with one embodiment. As an option, the present system may or may not incorporate any of the features described above with respect to FIG. 1A. Of course, however, the system may be implemented in any desired environment. It should also be noted that the aforementioned definitions may apply during the present description.

As shown, a circuit board 152 is provided with a northbridge circuit 154 and a southbridge circuit 156 mounted thereon. In the context of the present description, such northbridge circuit may include any circuit that handles data transactions between a central processing unit 158, a graphics processor device 160, and the southbridge circuit. Further, the southbridge circuit may include any circuit that manages onboard devices such as an integrated development environment (IDE) bus and a peripheral component interconnect (PC) bus (not shown). While the northbridge and southbridge circuits are disclosed herein, it should be noted that other chipsets are contemplated that communicate with the central processing unit and controls interaction with any memory.

With continuing reference to FIG. 1B, an airflow subsystem 162 is coupled to the circuit board for circulating external air about the northbridge circuit and the southbridge circuit. In various embodiments, such airflow subsystem (or any portion thereof) may be fixedly or pivotally coupled to the circuit board. Further, the airflow subsystem may be coupled above the northbridge circuit and/or the southbridge. circuit (as shown), or adjacent to such components.

In the context of the present description, the airflow subsystem may include any system capable of circulating air about the northbridge circuit and the southbridge circuit. In one embodiment, the airflow subsystem includes a fan 163. Strictly as an option, the airflow subsystem may include additional heat exchangers as well. For example, as shown, the fan may be coupled to a heat sink 164 that is positioned above the northbridge circuit and the southbridge circuit. Such heat sink may take any desired form. For example, it may be attached to the northbridge circuit and/or the southbridge circuit, and further provide a platform 166 for supporting the fan.

For providing access to the external air, the airflow subsystem may, in one embodiment, further include a conduit 168 for channeling the external air to the fan. Such conduit may, in various embodiments, include a flexible or rigid hose. Strictly as an option, a sensor (see FIG. 1A) may be used to automatically activate the fan.

To further enhance the ability of the airflow subsystem to circulate the external air, it may optionally be coupled to an additional airflow subsystem 170 (via the conduit, for example). In use, such additional airflow subsystem may be capable of circulating external air about additional components (other than the northbridge/southbridge circuit) such as a power sub-system, the central processing unit, a memory circuit, and the graphics device, etc. To accomplish this, the additional airflow subsystem may also include a fan 172.

In one embodiment, the airflow subsystem may serve to direct air in a direction in which the additional airflow subsystem directs air. Further, external air that may otherwise not be available for circulation about the northbridge/southbridge circuit may thus be available, despite the northbridge/southbridge circuit being centrally situated on the motherboard. To this end, at least some external air that is not first circulated about other components (and thus heated) may be used to cool the northbridge and southbridge circuits.

It should be again noted that the various features of FIGS. 1A-1B may or may not be used together. Additional embodiments will now be set forth where such features may be integrated. It should be strongly noted that the following information is set forth for illustrative purposes and should not be construed as limiting in any manner. Any of the following features may be optionally incorporated with or without the other features described.

Figure 2:
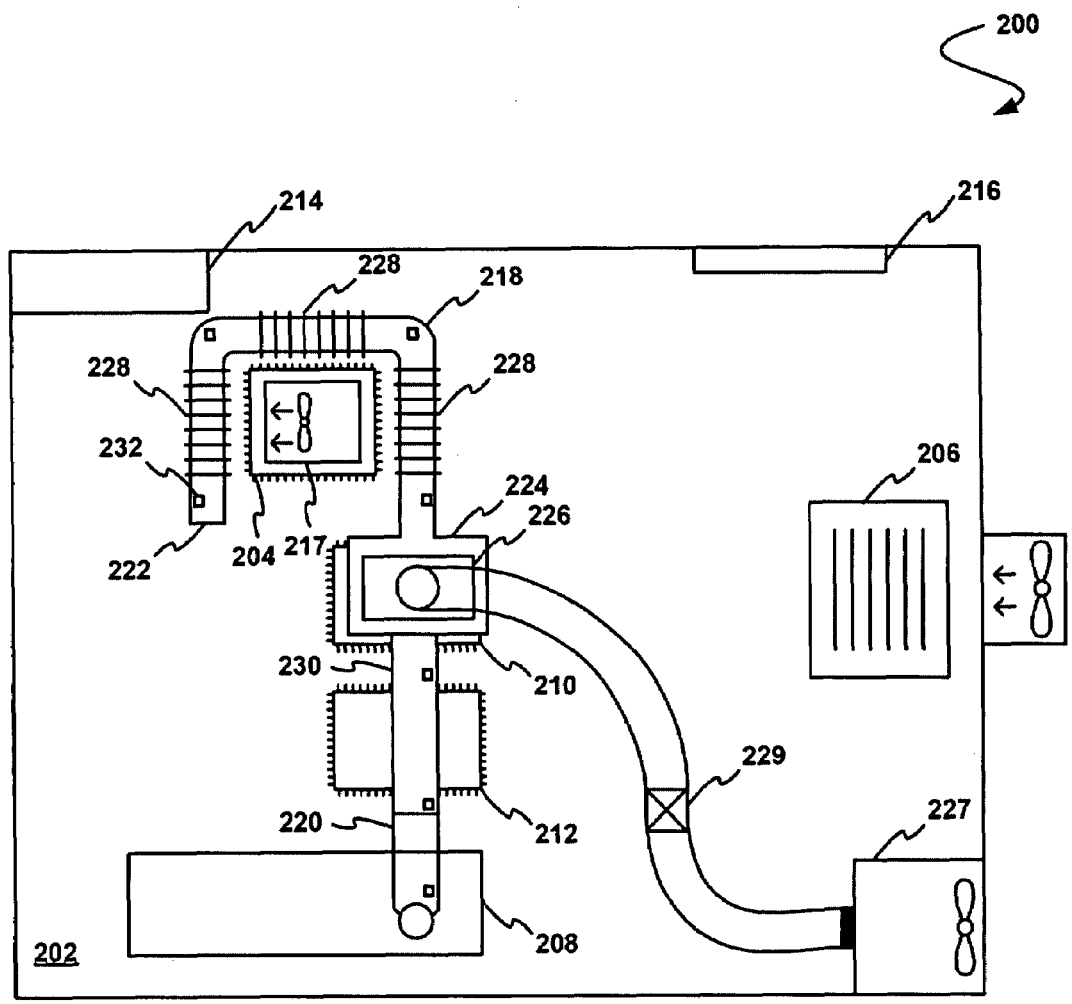
FIG. 2 shows a system for transferring heat from components of a circuit board, in accordance with one embodiment.

FIG. 2 shows a system 200 for transferring heat from components of a circuit board, in accordance with one embodiment. As an option, the present system may or may not incorporate any of the features described above with respect to FIGS. 1A-1B. Of course, however, the present system may be implemented in any desired environment. Yet again, the aforementioned definitions may apply during the present description.

As shown, a circuit board 202 is included in the form of a motherboard. Such circuit board includes various components including a central processing unit 204, memory circuits 206 (e.g. DRAM, etc.), a graphics processor mounted on an associated graphics card 208, a north bridge circuit 210, and a southbridge circuit 212. Still yet, additional components may include a power sub-system 214 for powering the circuit board and a port interface 216 for interfacing a variety of input/output (I/O) devices (not shown).

It should be noted that the various components set forth above may or may not have a dedicated heat exchanger. For example, the central processing unit is shown to be equipped with a fan 217. Further, while not shown, the graphics processor may also be equipped with a dedicated heat exchanger, as well.

Further included is a carrier 218 coupled to the circuit board. In one embodiment, the carrier may be constructed from a rigid material. For example, the carrier may be constructed from a printed circuit board (PCB) material. Of course, the use of other material (e.g. plastic, etc.) is contemplated.

In the illustrated embodiment, the carrier may include a first linear portion 220 with a first end that resides above (and possibly in contact with) the graphics card and a second end that terminates with the northbridge circuit. As shown, the first linear portion resides above and in contact with the southbridge circuit and part of the northbridge circuit.

Further included is a second U-shaped portion 222 that at least partially circumnavigates the central processing unit and the associated fan. The first linear portion and the second U-shaped portion of the carrier are each integrally connected to a central portion 224 that resides above and in contact with the northbridge circuit. As shown, the central portion of the carrier is sized and shaped similar to a size and shape of the northbridge circuit. While a specific carrier configuration is shown in FIG. 2, it should be noted that the exact shape and size of the carrier may vary as a function of the design of the circuit board and related components.

As further shown, a plurality of heat exchangers are coupled to the carrier. Specifically, an airflow subsystem in the form of a fan 226 is coupled to the central portion of the carrier. One exemplary fan that may be used will be set forth during the description of a different embodiment illustrated in FIGS. 4A-4B.

As an option, the fan may be coupled to a central airflow subsystem 227 that services the entire system. As shown, the central airflow subsystem has access to external air and serves to circulate air over a variety of system components. To provide such external air to the fan, any desired conduit (e.g. pipe, etc.) may be used to channel airflow from the central airflow subsystem to the fan. As an option, a valve 229 may be positioned at any desired location along the conduit or elsewhere for controlling such airflow.

In use, the fan is adapted to circulate air in the proximity of the northbridge circuit and/or southbridge circuit. Further, such air may or may not include external air provided by the central airflow subsystem. In various embodiments, the external air may be selectively incorporated based on any manual and/or automatic control mechanism. By this design, cooler air may be circulated about the northbridge circuit and/or southbridge circuit.

Still yet, three heat sinks 228 are positioned along each part of the second U-shaped portion of the carrier. As shown, such heat sinks include outwardly extending fins. As an option, a planar heat sink 230 may be mounted on the first linear portion of the carrier in contact with the southbridge circuit. In use, the planar heat sink may be used to provide thermal communication between the southbridge circuit and the northbridge circuit.

While the fan and various types of heat sinks are shown in FIG. 2, it should be strongly noted that different types of heat exchangers may be used at different locations along the carrier. To this end, the resultant heat exchanger system may be modular in design and allow for different configurations, based on the desires of the user. In furtherance of such modularity, the coupling mechanism that attaches the various heat exchangers to the carrier may be standardized.

For example, in one embodiment, a common clipping mechanism may be used to attach the heat exchangers to the carrier. In other embodiments, commonly configured holes (e.g. four holes in a square configuration, etc.) may be formed at different locations along the carrier for allowing the attachment of the desired heat exchanger. Of course, such coupling mechanisms are set forth for illustrative purposes only and should not be construed as limiting in any manner whatsoever.

As an additional option, a heat transfer medium may be coupled to or integrated with the carrier. For example, in one embodiment, the carrier may itself include a single heat pipe or the like. Of course, other embodiments are contemplated where the heat pipe may be attached to the carrier and the various heat exchangers may, in turn, be coupled to the heat pipe. Still yet, in other embodiments, separate discrete heat pipes may be coupled between the heat exchangers. In this embodiment, such discrete heat pipes may or may not be directly coupled to the carrier. For reasons that will soon become apparent during the description of a different embodiment illustrated in FIG. 3, one or more valves may be positioned along the heat pipe(s) for controlling the transfer of heat between the heat exchangers.

For providing enhanced control of the abovementioned components, a plurality of sensors 232 may be positioned along the carrier. While not shown, such sensors may be used to control any one of the various active heat exchangers, the aforementioned valves, and/or any other component of the circuit board. One exemplary interconnection that may be used will be set forth during the description of a different embodiment illustrated in FIG. 3.

In one embodiment, such sensors may be positioned at a fixed distance from the various corresponding circuit board components. To accomplish this, the configuration of the carrier may be standardized to accommodate a particular circuit board design and the components thereof. Further, the sensors may be fixed at predetermined locations along the carrier. Thus, since the interrelationship between the components-to-carrier and sensors-to-carrier is standardized (and thus known), the distance between the sensors and the corresponding components is also known. This feature may, in turn, be leveraged to avoid any sensor characterization, as set forth before.

Figure 3:
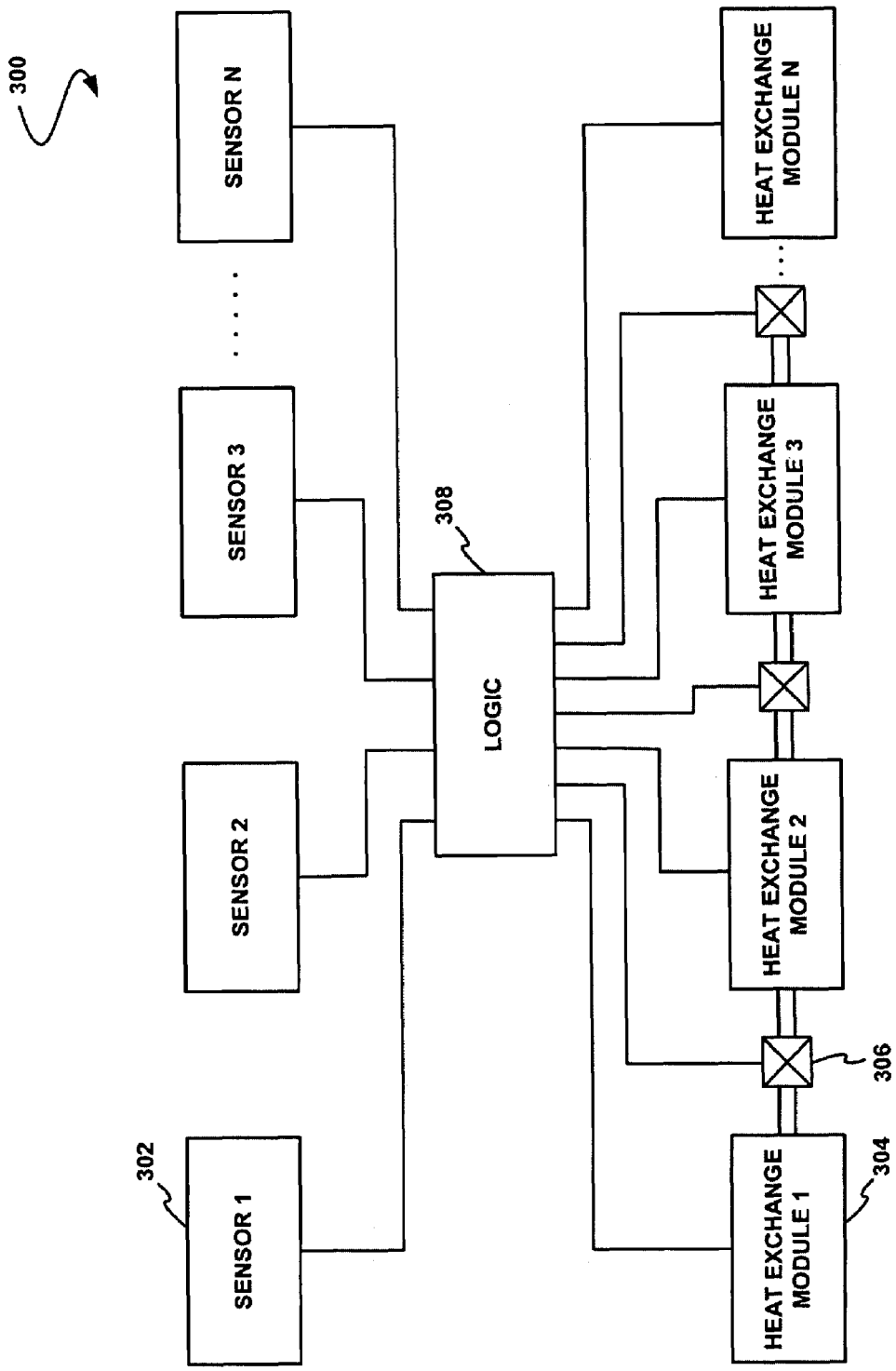
FIG. 3 shows a schematic for controlling various components of a circuit board, in accordance with one embodiment.

FIG. 3 shows a schematic 300 for controlling various components of a circuit board, in accordance with one embodiment. As an option, the present schematic may or may not incorporate any of the features described above with respect to FIGS. 1A-2. Of course, however, the present system may be implemented in any desired environment. Yet again, the aforementioned definitions may apply during the present description.

As shown, a plurality of sensors 302 are provided. Such sensors may include any temperature (e.g. heat) sensor capable of generating a signal indicative of a degree of heat emanating from an adjacent circuit board component. Non-limiting examples of such sensors may include, but are certainly not limited to thermometers, thermocouples, temperature sensitive resistors (e.g. thermistors, etc.), bi-metal thermometers, thermostats, etc.

Further provided is a plurality of heat exchangers 304. For example, the heat exchangers may include active heat exchangers such as a fan and/or a liquid-cooled apparatus. For reasons that will soon become apparent, a first heat exchanger may have a corresponding first sensor where both the first heat exchanger and sensor are positioned adjacent a first circuit board component. Similarly, a second heat exchanger may have a corresponding second sensor where both the second heat exchanger and sensor are positioned adjacent a second circuit board component, and so on.

In use, such heat exchangers may be activated and deactivated. In another possible embodiment, the heat exchangers may be operated with additional granularity (e.g. low-medium-high, levels 1-10, along a continuous scale, etc.). In embodiments involving pivoting fans, etc., a direction of such fan may be automatically oriented in a specifically controlled manner.

With continuing reference to FIG. 3, the heat exchangers may be coupled by way of one or more heat transfer mediums (e.g. heat pipe, etc.), for allowing heat to transfer among the heat exchangers. As a further option, a plurality of valves 306 may be positioned along the heat transfer medium for selectively controlling such heat transfer. In one embodiment, the valves may each include a heat valve that applies an increased amount of heat (beyond a predetermined threshold) at a select portion of a heat pipe. Such threshold amount of heat results in the heat pipe ceasing operation (e.g. by "drying out" the heat pipe, etc.). Of course, other embodiments are contemplated that utilize other mechanical, chemical, and/or electro-mechanical-based valves.

In use, the valves may be opened to allow the heat transfer and closed to preclude such heat transfer. In another possible embodiment, the valves may be operated with additional granularity (e.g. low-medium-high, levels 1-10, along a continuous scale, etc.), similar to the heat exchangers. Still yet, multiple valves may be independently controlled.

Coupled between the sensors, the heat exchangers, and the valves is control logic 308 for controlling the heat exchangers and the valves as a function of the signals received from the sensors. In various embodiments, the control logic may be administered by an operating system [e.g. a basic input/output system (BIOS) of the operating system, etc.]. In other embodiments, the control logic may be embodied on a separate integrated circuit platform. Further, any of the components shown in FIG. 3 may or may not receive power from the circuit board.

In one example of use, the control logic is adapted for activating any one or more of the heat exchangers in response to a signal from a corresponding sensor that indicates a temperature of an associated component being less or greater than a predetermined amount. Further, a valve may be activated or deactivated based on a need to transfer heat amongst the circuit board components (e.g. via the heat exchangers, etc.). For example, upon receiving a signal indicating that a first temperature of a first circuit board component associated with a first heat exchanger has risen beyond a predetermined threshold and a second temperature of a second circuit board component associated with a second heat exchanger falling below another predetermined threshold, a valve between the first heat exchanger and the second heat exchanger may be opened to allow heat transfer therebetween.

While not shown, the various components shown in FIG. 3 may also interface with an additional heat exchange system (e.g. a central heat exchange system, a CPU heat exchange system, etc.) for working in conjunction as a single system. Further, one or more valves may be coupled therebetween, thus allowing for controlled heat transfer in accordance with any desired algorithm.

Figure 4A:
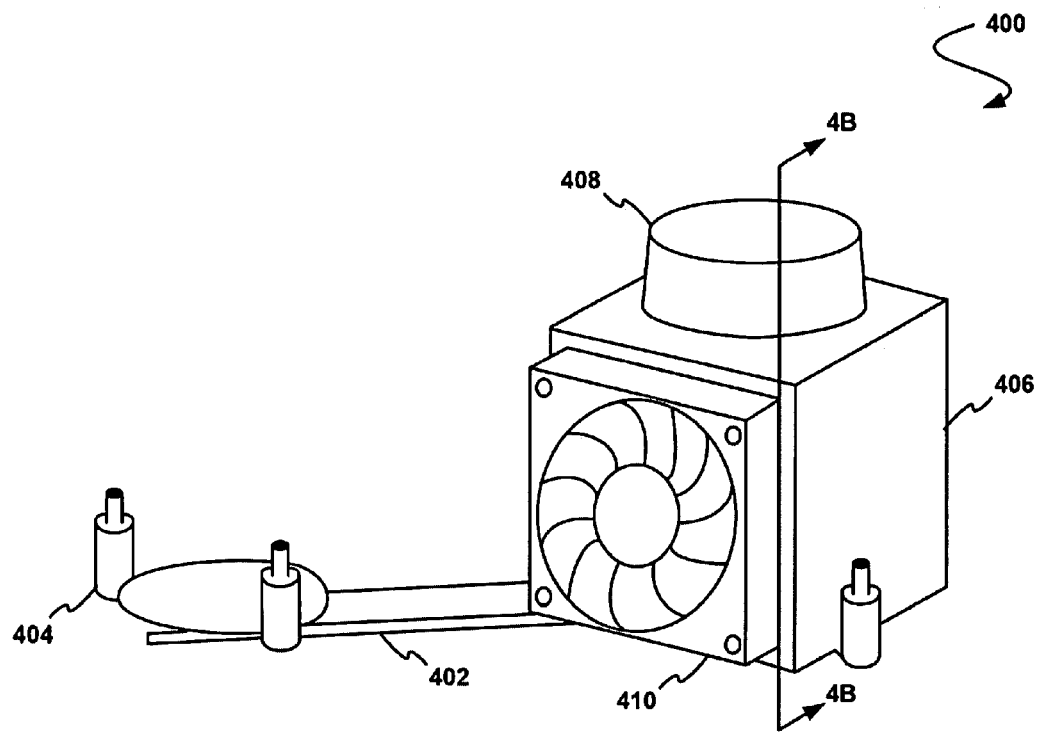
FIGS. 4A-4B show an airflow subsystem for circulating air about a northbridge and/or southbridge circuit, in accordance with one embodiment.

FIG. 4A is a perspective view of an airflow subsystem 400 for circulating air about a northbridge and/or southbridge circuit, in accordance with one embodiment. As an option, the present airflow subsystem may be implemented in the context of the architecture and/or functionality of FIG. 1 A-3. For example, the fan 226 of FIG. 2, may take the form of the present airflow subsystem. Of course, however, the present airflow subsystem may be implemented in any desired environment. Again, the aforementioned definitions may apply during the present description.

As shown in FIG. 4A, the present airflow subsystem includes a heat sink 402 with a substantially planar configuration having a first end with a plurality of mounts 404 for coupling the first end of the heat sink atop a southbridge circuit. The heat sink further includes a second end with a housing 406 coupled thereon. In one embodiment, the housing may optionally be pivotally coupled to the second end of the heat sink for rotating about a vertical axis. As an option, the housing may also be equipped with mounts for being coupled atop a northbridge circuit.

The housing is formed to take on a substantially cubical configuration defined by a bottom face, a top face, and a plurality of side walls formed therebetween. The top face has an opening 408 formed therein with an upwardly extending lip. Such lip is adapted for engaging with a conduit (e.g. a rigid or flexible pipe) for allowing airflow to be directed from a central airflow subsystem or an external orifice, to the present airflow subsystem.

Figure 4B:
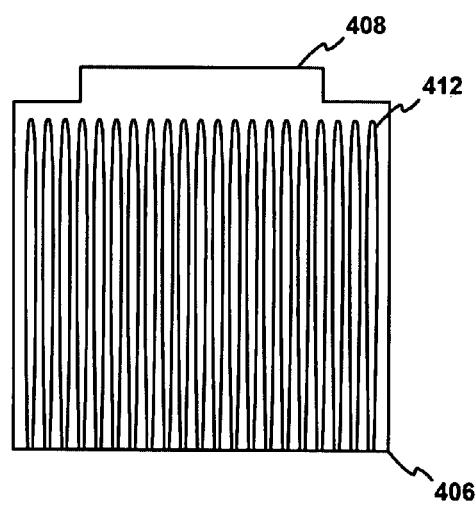

With continuing reference to FIG. 4A, one of the side walls of the housing is equipped with a fan 410 for circulating air around the northbridge circuit. Specifically, the fan may draw air through the opening on the top face of the housing through a plurality of heat dissipating fins (not shown) within the housing. FIG. 4B is a cross-sectional view of the airflow subsystem of FIG. 4A taken along line 4B-4B, in accordance with one embodiment. As shown, the aforementioned fins 412 are shown to remain in communication with the underlying heat sink for drawing heat from the northbridge circuit, during use.

Figure 5:
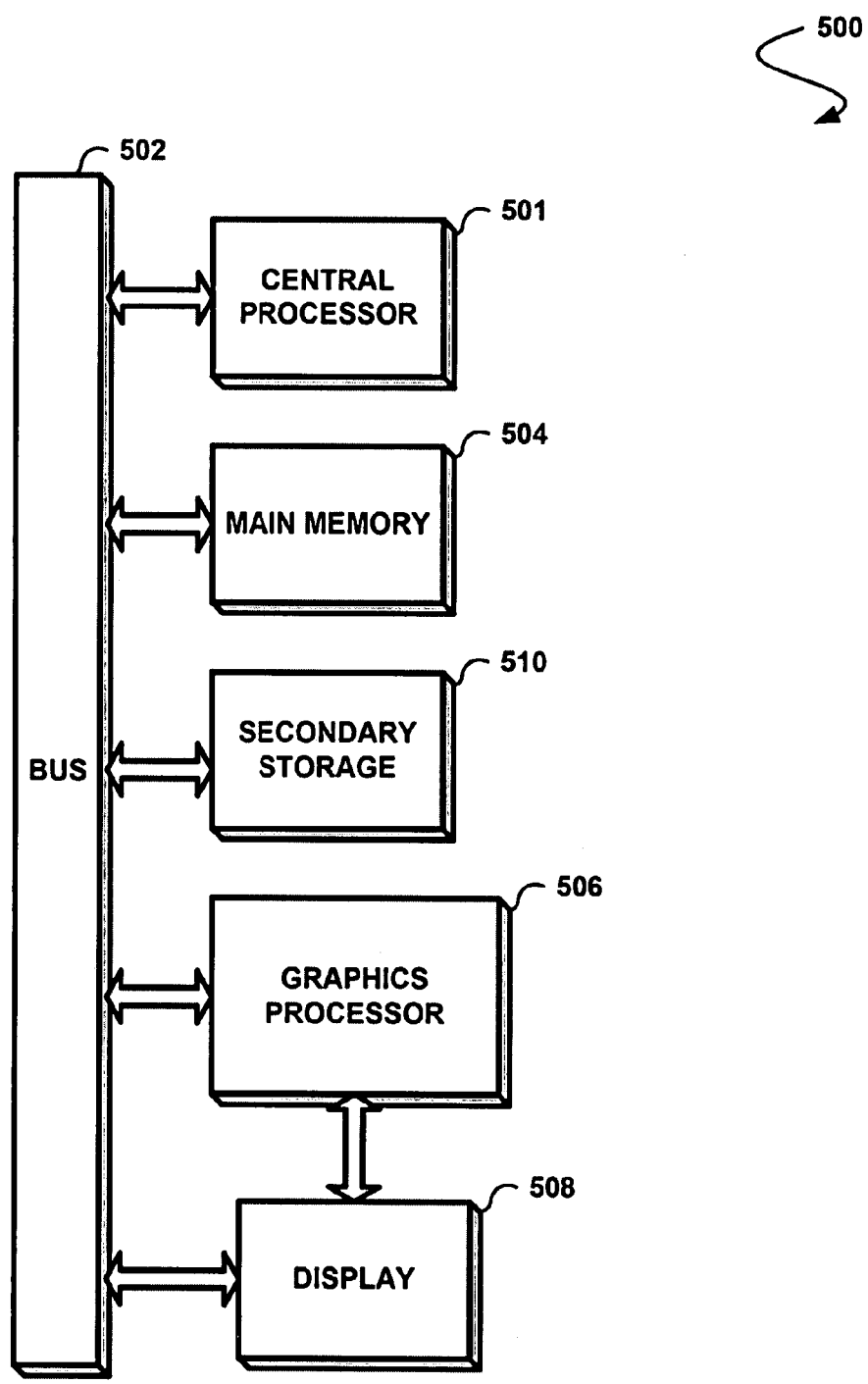
FIG. 5 illustrates an exemplary system in which the various architecture and/or functionality of the various previous embodiments may be implemented.

FIG. 5 illustrates an exemplary system 500 in which the various architecture and/or functionality of the various previous embodiments may be implemented. For example, one or more of the components of the present embodiment may be mounted on the circuit board of the previous figures.

As shown, the system is provided including at least one host processor 501 which is connected to a communication bus 502. The system 500 also includes a main memory 504. Control logic (software) and data are stored in the main memory 504 which may take the form of random access memory (RAM).

The system also includes a graphics processor 506 and a display 508, i.e. a computer monitor. In one embodiment, the graphics processor may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user.

The system 500 also include a secondary storage 510. The secondary storage includes, for example, a hard disk drive and/or a removable storage drive, representing a floppy disk drive, a magnetic tape drive, a compact disk drive, etc. The removable storage drive reads from and/or writes to a removable storage unit in a well known manner.

Computer programs, or computer control logic algorithms, may be stored in the main memory and/or the secondary storage. Such computer programs, when executed, enable the system to perform various functions. The memory, storage and/or any other storage are possible examples of computer-readable media.

In one embodiment, the architecture and/or functionality of the various previous figures may be implemented in the context of the host processor, graphics processor, an integrated circuit (not shown) that is capable of at least a portion of the capabilities of both the host processor and the graphics processor, a chipset (i.e. a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system may take the form of a desktop computer, lap-top computer, and/or any other type of logic. Still yet, the system may take the form of various other devices m including, but not limited to a personal digital assistant (PDA) device, a mobile phone device, a television, etc.

Further, while not shown, the system may be coupled to a network [e.g. a telecommunications network, local area network (LAN), wireless network, wide area network (WAN) such as the Internet, peer-to-peer network, cable network, etc.] for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A system, comprising:
a circuit board with components mounted thereon;
a controllable heat transfer medium for controlling a transfer of heat between the components; and
a plurality of heat exchangers coupled to the components;
wherein the system is operable such that the controllable heat transfer medium is coupled between the heat exchangers;
wherein an operating system is used to control at least one aspect of the controllable heat transfer medium.

2. The system of claim 1, wherein the circuit board includes a motherboard.

3. The system of claim 1, wherein the components include at least one of a power sub-system, a central processing unit, a memory circuit, a graphics processor, a north bridge circuit, and a southbridge circuit.

4. The system of claim 1, wherein the heat exchangers include at least one of a heat sink, a fan, and a liquid-cooled apparatus.

5. The system of claim 1, wherein a sensor is used to control at least one of the heat exchangers.

6. The system of claim 1, and further comprising a carrier mounted to the circuit board.

7. The system of claim 6, wherein the controllable heat transfer medium is integrated with the carrier.

8. The system of claim 6, wherein the controllable heat transfer medium is coupled to the carrier.

9. The system of claim 6, wherein the controllable heat transfer medium includes at least one of a heat pipe, a vapor chamber, and a thermal chamber.

10. The system of claim 1, and further comprising a sensor used to control the at least one aspect of the controllable heat transfer medium.

11. The system of claim 1, wherein the controllable heat transfer medium includes at least one valve for controlling the transfer heat.

12. The system of claim 11, and further comprising a sensor for use in controlling the valve.

13. The system of claim 11, wherein the operating system is used to control the valve.

14. The system of claim 12, wherein a plurality of the sensors are coupled to a carrier with a fixed distance between each of the sensors and a corresponding one of the components.

15. The system of claim 14, wherein the system is operable such that the fixed distance between each of the sensors and the corresponding one of the components is standardized, such that, by using the carrier, the fixed distance is assumed to be present.

16. A method, comprising:
providing a circuit board with components mounted thereon; and
controlling a transfer of heat between the components, utilizing a controllable heat transfer medium;
wherein a plurality of heat exchangers are coupled to the components;
wherein the controllable heat transfer medium is coupled between the heat exchangers;
wherein an operating system is used to control at least one aspect of the controllable heat transfer medium.

17. An apparatus, comprising:
a controllable heat transfer medium capable of being mounted to a circuit board for controlling a transfer of heat between the components of the circuit board; and
a plurality of heat exchangers coupled to the components;
wherein the apparatus is operable such that the controllable heat transfer medium is coupled between the heat exchangers;
wherein an operating system is used to control at least one aspect of the controllable heat transfer medium.

18. The apparatus of claim 17, wherein the components include at least one of a power sub-system, a central processing unit, a memory circuit, a graphics processor, a north bridge circuit, and a southbridge circuit.

* * * * *

UNITED STATES PATENT AND TRADEMARK OFFICE
CERTIFICATE OF CORRECTION

Page 1 of 1

PATENT NO. : 7,619,889 B2
APPLICATION NO. : 11/841547
DATED : November 17, 2009
INVENTOR(S) : Yu et al.

It is certified that error appears in the above-identified patent and that said Letters Patent is hereby corrected as shown below:

In the specification:
    Col. 2, line 49, please replace "10" with -- 110 --;
    Col. 3, line 36, please replace "virture" with -- virtue --;
    Col. 3, line 59, please replace "(PC)" with -- (PCI) --.

In the claims:
    Col. 10, line 17, please replace "transfer heat" with -- transfer of heat --.

Signed and Sealed this
Thirty-first Day of May, 2011

David J. Kappos
*Director of the United States Patent and Trademark Office*